(12) United States Patent
Li et al.

(10) Patent No.: US 11,139,843 B1
(45) Date of Patent: Oct. 5, 2021

(54) SERDES DRIVER WITH COMMON-GATE-BASED BUFFER TO USE CORE DEVICES IN RELATIVELY HIGH POWER SUPPLY DOMAIN

(71) Applicant: QUALCOMM Incorporated, San Diego, CA (US)

(72) Inventors: Miao Li, San Diego, CA (US); Jie Xu, San Diego, CA (US); Yu Song, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/927,537

(22) Filed: Jul. 13, 2020

(51) Int. Cl.
*H04L 27/00* (2006.01)
*H04B 1/04* (2006.01)
*H03K 19/0185* (2006.01)

(52) U.S. Cl.
CPC ....... *H04B 1/04* (2013.01); *H03K 19/018521* (2013.01)

(58) Field of Classification Search
CPC .......................... H04B 1/04; H03K 19/018521
USPC .................................................. 375/259, 295
See application file for complete search history.

(56) References Cited

U.S. PATENT DOCUMENTS

| | | | | |
|---|---|---|---|---|
| 5,867,053 A | * | 2/1999 | Engles | G11C 7/1051 327/407 |
| 8,446,173 B1 | * | 5/2013 | Faucher | H03K 19/017509 326/86 |
| 2011/0150138 A1 | * | 6/2011 | Park | H03H 19/004 375/316 |
| 2015/0163747 A1 | * | 6/2015 | Chen | H04B 1/109 455/78 |
| 2015/0187323 A1 | * | 7/2015 | Jin | G09G 3/2092 345/215 |
| 2016/0134266 A1 | * | 5/2016 | Cohen | H03K 5/135 327/158 |
| 2019/0311676 A1 | * | 10/2019 | Chaji | G09G 3/3233 |

* cited by examiner

*Primary Examiner* — Don N Vo
(74) *Attorney, Agent, or Firm* — Patterson+ Sheridan, L.L.P.

(57) ABSTRACT

Certain aspects of the present disclosure generally relate to a driver circuit for a serializer/deserializer (SerDes) transmitter and techniques for operating such a driver circuit. One example driver circuit generally includes a pre-driver circuit, an output stage circuit, and a common-gate buffer circuit coupled between an output of the pre-driver circuit and a first input of the output stage circuit.

20 Claims, 7 Drawing Sheets

SERDES DRIVER WITH COMMON-GATE-BASED BUFFER TO USE CORE DEVICES IN RELATIVELY HIGH POWER SUPPLY DOMAIN

BACKGROUND

Field of the Disclosure

Certain aspects of the present disclosure generally relate to electronic circuits and, more particularly, to a driver circuit for a serializer/deserializer (SerDes) transmitter.

Description of Related Art

The use of high-speed serial communication links in electronic systems has continued to grow. In certain cases, serial interfaces may be used for inter-integrated circuit (IC) communications within an electrical device (e.g., a serial bus between a storage device and a processing system) and/or between electrical devices (e.g., serial bus between a computer and a smart watch). In other cases, the serial interfaces may be used for inter-circuit communications within a system-on-chip (SoC). High-speed serial communication links can operate according to various standards such as Universal Serial Bus (USB), High-Definition Multimedia Interface (HDMI), Serial Advanced Technology Attachment (SATA), and Peripheral Component Interconnect Express (PCIe) interfaces. A serializer/deserializer (SerDes) is used to transmit and receive data via a serial communication link. A SerDes transmitter serializes a multi-bit word into a serial data stream of corresponding bits. A SerDes receiver deserializes the received serial data stream into the original multi-bit word. In some SerDes systems, a clock signal is transmitted along with the serial data stream, whereas in other SerDes systems, the clock signal is instead embedded in the serial data stream.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include increased signal integrity in high-speed serializer/deserializer (SerDes) transmissions.

Certain aspects of the present disclosure provide a driver circuit for a serializer/deserializer (SerDes) transmitter. The driver circuit generally includes a pre-driver circuit, an output stage circuit, and a common-gate buffer circuit coupled between an output of the pre-driver circuit and a first input of the output stage circuit.

Certain aspects of the present disclosure provide a serializer/deserializer (SerDes) comprising the driver circuit described herein.

Certain aspects of the present disclosure are directed to a method of driving data for a SerDes transmitter. The method generally includes receiving, at a common-gate buffer circuit, the data from a pre-driver circuit, level-shifting the received data with the common-gate buffer circuit, and driving the level-shifted data with an output stage circuit.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure generally relate to a common-gate-based buffer utilized between a pre-driver and a final driver stage in a serial/deserializer (SerDes) transmitter. The common-gate buffer structure is used to level shift high-speed signals in a relatively low power supply domain to a relatively high power supply domain, thereby increasing the output voltage swing and signal integrity in SerDes systems.

Example SerDes System

Figure 1:
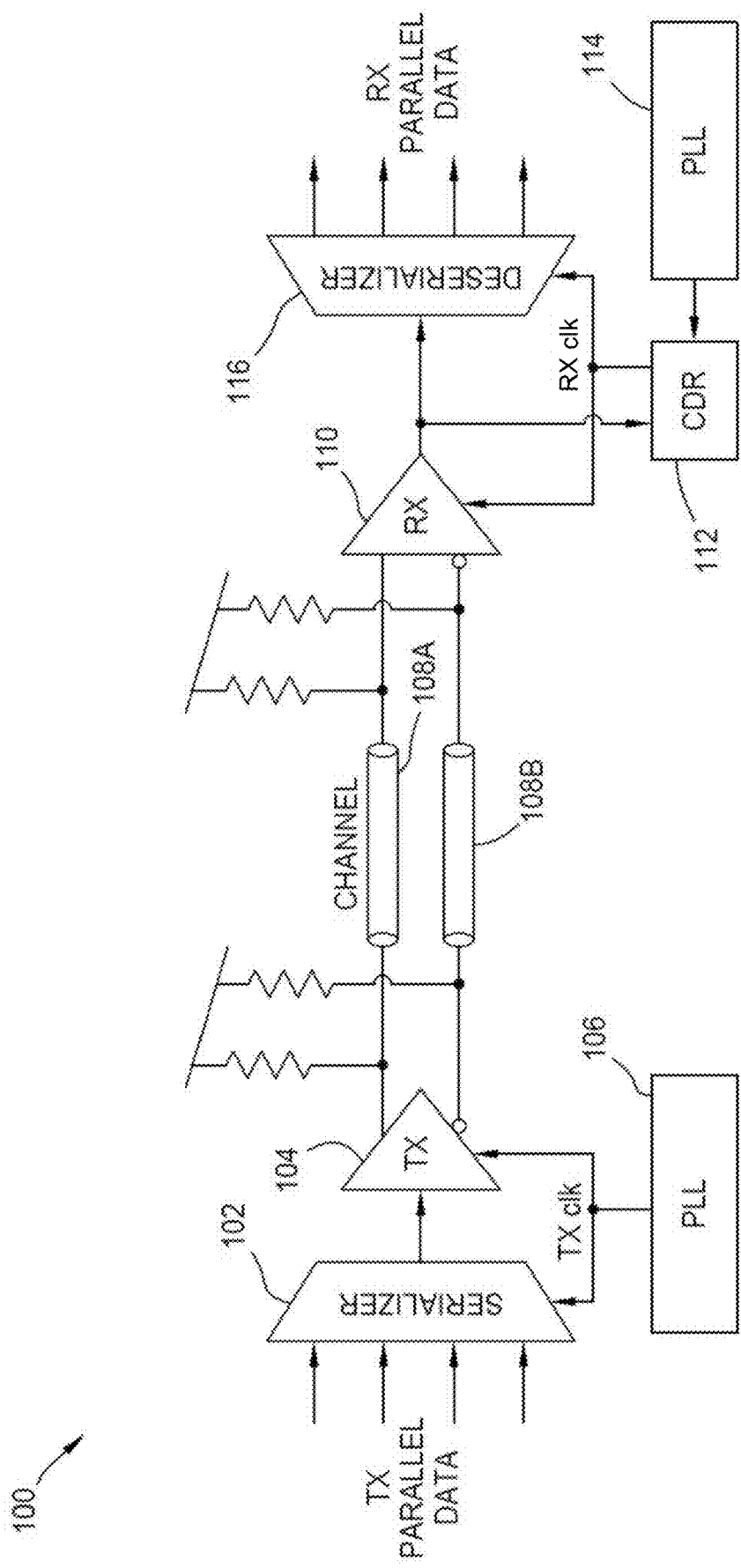
FIG. 1 is a block diagram of an example serializer/deserializer (SerDes) system having a SerDes transmitter and a SerDes receiver, in which aspects of the present disclosure may be practiced.

FIG. 1 is a block diagram of an example SerDes system 100, in accordance with certain aspects of the present disclosure. As shown, the SerDes system 100 may include a serializer 102, a SerDes transmitter 104 (labeled "TX"), a phase-locked loop (PLL) 106 for providing a transmit clock, a differential pair of serial channels 108A, 108B, a SerDes receiver 110 (labeled "RX"), a clock data recovery (CDR) circuit 112, a PLL 114 on the receive side, and a deserializer 116.

The serializer 102 converts data received on a parallel interface to a serial interface and provides a signal (e.g., a bitstream) of the serial data to the SerDes transmitter 104. The SerDes transmitter 104 may be implemented as a driver, which may amplify the serial data signal and output a differential signal on the serial channels 108A, 108B. In certain aspects, the differential signal may be a low-voltage differential signal (LVDS). In certain aspects, the serial channel 108A may carry the non-inverted signal of the differential pair, and the serial channel 108B may carry the inverted signal (i.e., the complementary signal) of the differential pair. In aspects, the differential signal output by the SerDes transmitter 104 may be sampled and generated according to the transmit clock output by the PLL 106. In aspects, the PLL 106 may be used as a clock-synthesizer circuit that generates a high-speed master clock used for the serial data transmission.

The SerDes receiver 110 receives the differential signal of the serial data on the serial channels 108A, 108B and may amplify the received differential signal. In certain aspects, the SerDes receiver 110 may perform equalization of the received differential signal. The CDR circuit 112 is coupled to the output of the SerDes receiver 110 and performs the timing recovery to recover the master clock used to sample the signals and generate a receive clock at the SerDes receiver 110. In certain aspects, the CDR circuit 112 may receive a reference clock signal via the PLL 114. The deserializer 116 converts the serial signal output by the SerDes receiver 110 to parallel form.

In high-speed SerDes transmitter design for portable, battery-operated devices, for example, voltage-mode logic (VML) drivers may offer lower power consumption than current-mode logic (CIVIL) drivers. In VML design, core devices may be used due to lower parasitics and faster switching speed compared to input/output (I/O) devices. In VML, however, output voltage swing is determined by power supply levels, and core devices' relatively low power supply limits the output swing. When core devices are used in a relatively high power supply domain (such as that provided to I/O devices), the breakdown voltages of the core transistors may be exceeded, thereby leading to reliability issues.

Certain aspects of the present disclosure provide a driver for a SerDes transmitter with a common-gate-based buffer between the pre-driver and the final driver stage. In this manner, the voltage level applied to the p-type metal-oxide-semiconductor (PMOS) transistors in the final driver stage is level-shifted up, and the PMOS transistors may still be implemented as core devices with fast switching speeds. For example, a typical input voltage swing on the PMOS transistors may go from 0 V to VDD, where VDD (e.g., 0.875 V) is the low power supply domain for the core devices. With level shifting, the voltage swing may go from VDDH-VDD to VDDH, where VDDH (e.g., 1.2 V) is the high power supply domain for the I/O devices. Therefore, the PMOS transistors remain in their working range, and there are no reliability issues.

Example SerDes Transmitter

Figure 2:
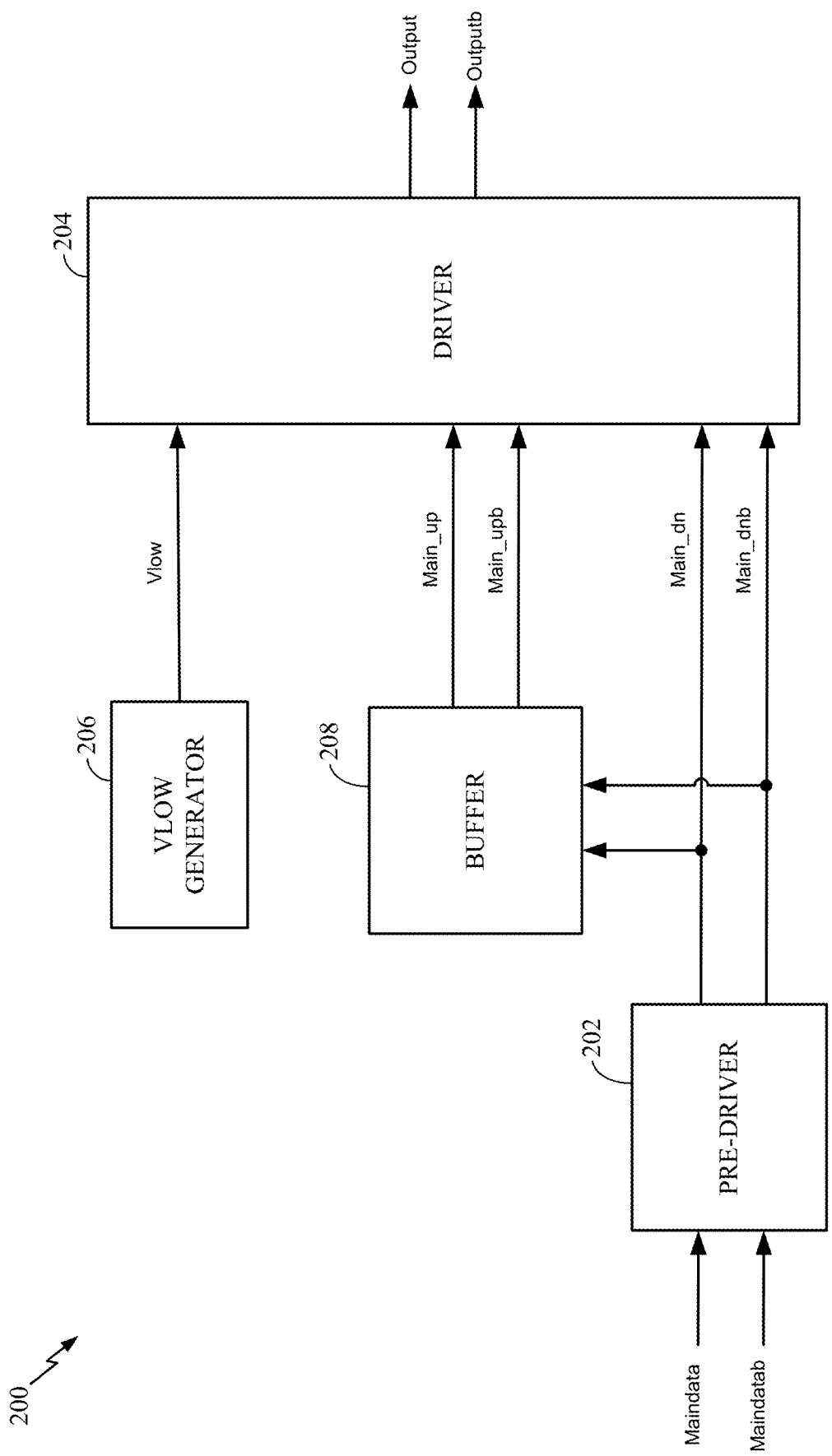
FIG. 2 is a block diagram of an example SerDes transmitter, in accordance with certain aspects of the present disclosure.

FIG. 2 is a block diagram of an example SerDes transmitter 200, in accordance with certain aspects of the present disclosure. The SerDes transmitter 200 may be used, for example, to implement the SerDes transmitter 104 in the SerDes system 100 of FIG. 1. The SerDes transmitter 200 may include a pre-driver circuit 202 and a driver output stage circuit 204. For certain aspects, the SerDes transmitter 200 may also include a buffer circuit 208 and a voltage generation circuit 206 for generating Vlow (also referred to as a "Vlow generator"), as described below.

The pre-driver circuit 202 may receive one or more input signals, such as differential input signal Maindata/Maindatab, where Maindatab is the complementary signal of Maindata. The pre-driver circuit 202 may buffer and/or amplify the received input signal(s), generating one or more output signals, such as differential output signal Main_dn/Main_dnb (or Main/Mainb). The driver output stage circuit 204 has one or more inputs coupled to one or more outputs of the pre-driver circuit 202. In a conventional SerDes transmitter, the driver output stage circuit 204 amplifies the signal(s) received from the pre-driver circuit 202 to generate one or more output signals, such as differential output signal Output/Outputb, for transmission on one or more channels (e.g., serial channels 108A, 108B) to the SerDes receiver.

Example Driver Output Stages for SerDes Transmitter

Figures 3A, 3B:
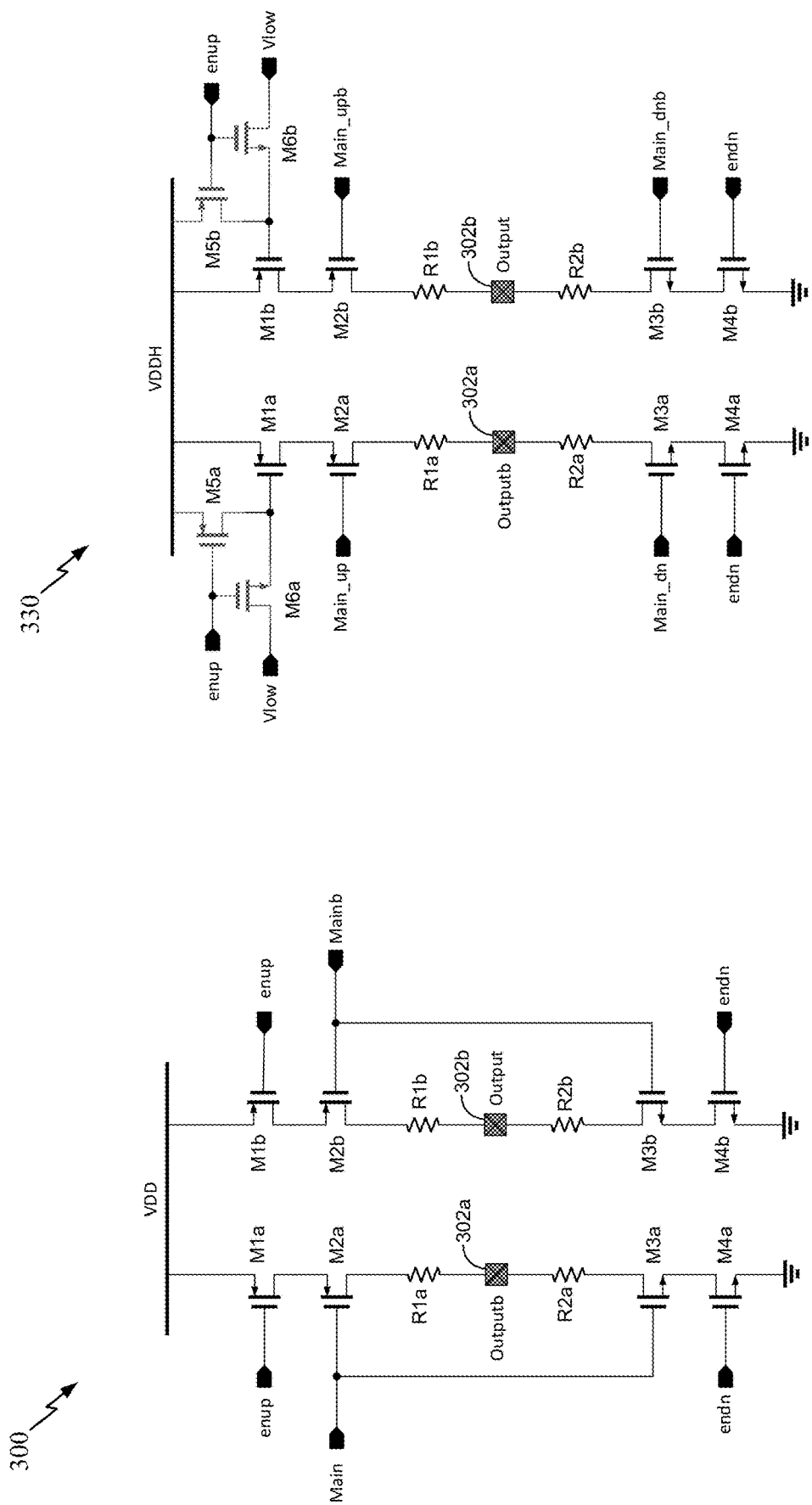
FIG. 3A is a circuit diagram of an example driver output stage circuit operating in a relatively low power supply domain with a single differential pair of inputs, in accordance with certain aspects of the present disclosure.
FIG. 3B is a circuit diagram of an example driver output stage circuit operating in a relatively high power supply domain with two separate differential pairs of inputs, in accordance with certain aspects of the present disclosure.

FIG. 3A is a circuit diagram of an example driver output stage circuit 300 operating in the relatively low power supply domain (e.g., VDD) with a single differential pair of inputs (e.g., differential input Main/Mainb). The driver output stage circuit 300 is implemented as a differential push-pull complementary metal-oxide-semiconductor (CMOS) inverter with enable switches. For example, the driver output stage circuit 300 includes PMOS transistors M2a/M2b and n-type metal-oxide-semiconductor (NMOS) transistors M3a/M3b for receiving the differential input Main/Mainb at the gates of the transistors M2a/M2b/M3a/M3b, as illustrated. Upper enabling switches (implemented as PMOS transistors M1a/M1b) may be coupled between the sources of PMOS transistors M2a/M2b and the low power supply rail VDD. The gates of PMOS transistors M1a/M1b may receive the upper enabling signal (labeled "enup"). For certain aspects, all transistors M1a/M1b-M4a/M4b in the driver output stage circuit 300 may be core devices.

Lower enabling switches (implemented as NMOS transistors M4a/M4b) may be coupled between the sources of NMOS transistors M3a/M3b and the reference potential node (e.g., electrical ground) for the driver output stage circuit 300. The gates of NMOS transistors M4a/M4b may receive the lower enabling signal (labeled "endn"). Resistive elements R1a/R1b may be coupled between drains of PMOS transistors M2a/M2b and output nodes 302a/302b of the driver output stage circuit 300. Likewise, resistive elements R2a/R2b may be coupled between drains of NMOS transistors M3a/M3b and the output nodes 302a/302b.

In operation when enable signal enup is logic low and enable signal endn is logic high, the driver output stage circuit 300 receives the differential input signal Main/Mainb and generates the differential output signal Outputb/Output at the output nodes 302a/302b, respectively, with a voltage swing from 0 V to VDD (e.g., 0.875 V) in the relatively low power supply domain. In this low power supply domain, both the PMOS transistors M2a/M2b and the NMOS transistors M3a/M3b can switch concurrently without a reliability problem (e.g., due to shoot-through current). Thus, the differential input Main/Mainb can be shared with the gates of both the PMOS transistors M2a/M2b and the NMOS transistors M3a/M3b.

To increase the signal-to-noise ratio (SNR) and signal integrity for high-speed signals, it may help to increase the output voltage swing, for example, by connecting the PMOS transistors M2a/M2b and upper enabling switches to a relatively high power supply domain (e.g., VDDH). However, simply changing the power supply rail from VDD to VDDH in the driver output stage circuit 300 may damage the core devices and introduce reliability issues. While the core devices could be substituted for I/O devices with higher breakdown voltages, core devices are typically preferred in high-speed driver design for having lower parasitics and faster switching speeds compared to I/O devices. To solve this challenge, certain aspects of the present disclosure level shift high-speed signals in the low power supply domain to a high power supply domain.

Therefore, returning to FIG. 2, the SerDes transmitter 200 may further include the buffer circuit 208 coupled between the output(s) of the pre-driver circuit 202 and one or more additional inputs of the driver output stage circuit. The output signal(s) from the pre-driver circuit 202, such as differential output signal Main_dn/Main_dnb (also referred to herein as "Main_dn/Mainb dn"), may be level-shifted up by the buffer circuit 208, thereby generating one or more additional input signals for the driver output stage circuit 204, such as differential signal Main up/Main upb (also referred to herein as "Main up/Mainb up"). Furthermore, the voltage generation circuit 206 may generate and supply Vlow to the driver output stage circuit 204, which has a different design for generating the output signal(s) from two sets of input signals (one being level-shifted with respect to the other), as explained below with respect to FIG. 3B.

Figure 3C:
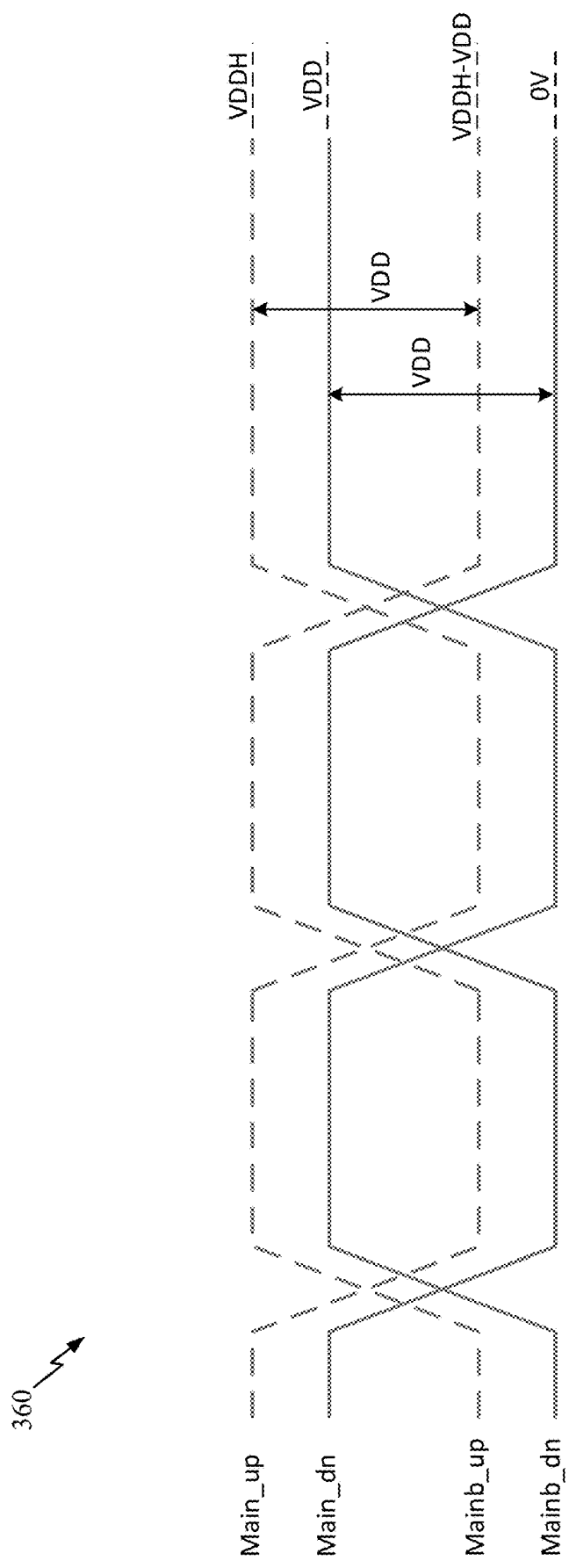
FIG. 3C is a plot of example waveforms of the two differential pairs of inputs in the driver output stage circuit of FIG. 3B, in accordance with certain aspects of the present disclosure.

FIG. 3B is a circuit diagram of an example driver output stage circuit 330 operating in the relatively high power supply domain (e.g., VDDH), in accordance with certain aspects of the present disclosure. In this design, the differential PMOS and NMOS inputs are separated since these inputs operate with different voltage levels. Thus, in the driver output stage circuit 330, PMOS transistors M2a/M2b receive the level-shifted differential input signal Main up/Main upb (e.g., operating from VDDH-VDD to VDDH as illustrated in the plot 360 of FIG. 3C) from the buffer circuit 208, whereas NMOS transistors M3a/M3b receive the differential input signal Main_dn/Main_dnb (e.g., operating from 0 V to VDD as depicted in the plot 360 of FIG. 3C) from the pre-driver circuit 202. As illustrated in the plot 360 of FIG. 3C, both differential input signals Main up/Main upb and Main_dn/Main_dnb have rail-to-rail voltage swings of VDD total volts between their respective voltage levels.

In addition, the driver output stage circuit 330 includes PMOS transistors M5a/M5b and NMOS transistors M6a/M6b to implement the upper enabling switches. PMOS transistors M5a/M5b and NMOS transistors M6a/M6b may be implemented as I/O devices to tolerate the high power supply domain, whereas the other transistors M1a/M1b-M4a/M4b may be implemented as core devices. PMOS transistors M5a/M5b may have sources coupled to the high power supply rail (VDDH), drains coupled the gates of PMOS transistors M1a/M1b, and gates configured to receive the enup signal. NMOS transistors M6a/M6b may have sources coupled to the gates of PMOS transistors M1a/M1b, gates coupled to the gates of PMOS transistors M5a/M5b and configured to receive the enup signal, and drains coupled to an output of the voltage generation circuit 206 and configured to receive Vlow, which may be a fixed voltage equal to VDDH−VDD (e.g., 0.325 V). Vlow may be used to guarantee that the PMOS transistors M1a/M1b can be turned on within a safe range.

Example Vlow Voltage Generator

Figure 4:
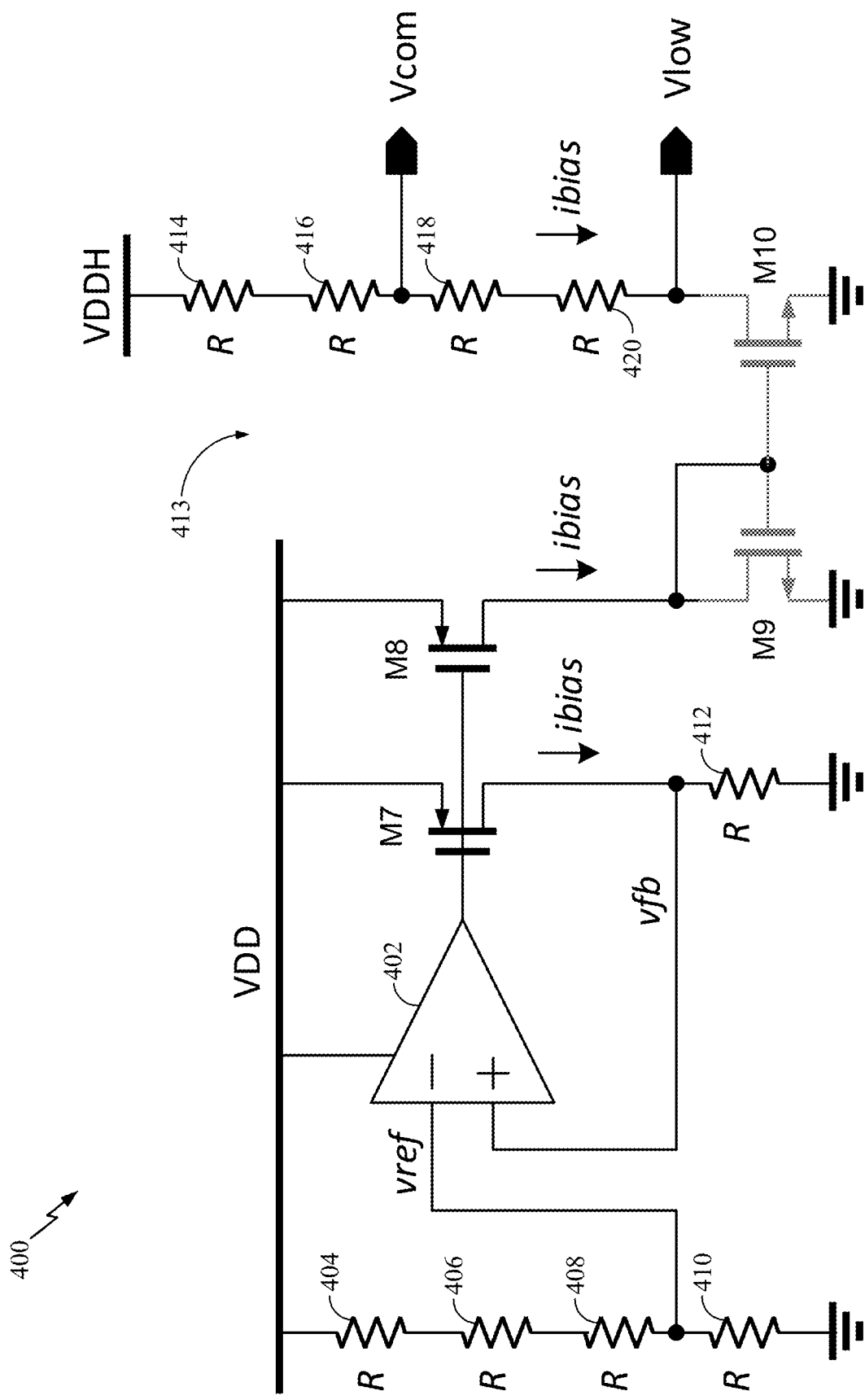
FIG. 4 is a circuit diagram of an example voltage generator for generating Vlow for use in the driver output stage circuit of FIG. 3B, in accordance with certain aspects of the present disclosure.

FIG. 4 is a circuit diagram of an example voltage generator 400 for generating Vlow for use in the driver output stage circuit 330 of FIG. 3B, in accordance with certain aspects of the present disclosure. Thus, the voltage generator 400 may be an example implementation of the voltage generation circuit 206 of FIG. 2. The voltage generator 400 may include an amplifier 402; resistive elements 404, 406, 408, 410, 412, 414, 416, 418, and 420; PMOS transistors M7 and M8; and NMOS transistors M9 and M10.

The resistive elements 404, 406, 408, 410, 412, 414, 416, 418, and 420 may all have the same resistance R (e.g., R=20 kΩ). The resistive elements 404, 406, 408, and 410 may be coupled in series between the low power supply rail (VDD) and the reference potential node (e.g., electric ground) for the voltage generator. The resistive elements 404, 406, 408, and 410 may function as a voltage divider having a tap between resistive elements 408 and 410 coupled to a negative input of the amplifier 402. With all the resistive elements 404, 406, 408, and 410 having the same resistance R, the voltage (labeled "vref") at the tap may be equal to VDD/4. The power supply inputs of the amplifier 402 may be coupled to the low power supply rail (VDD) and the reference potential node. PMOS transistor M7 may have a source coupled to the low power supply rail, a drain coupled to the positive input of the amplifier 402, and a gate coupled to the output of the amplifier 402. Resistive element 412 may be coupled between the drain of the PMOS transistor M7 and the reference potential node. In this manner, the amplifier 402 will drive the PMOS transistor M7 such that the feedback voltage (labeled "vfb") at the positive input equals vref (within an offset voltage of the amplifier) and generate a reference current (labeled "ibias") across the resistive element 412 (where ibias=vfb/R, which is approximately equal to VDD/4R, the current through the voltage divider comprising resistive elements 404, 406, 408, and 410).

The output of the amplifier 402 also drives a current mirror 413 composed of the PMOS transistor M8 and the NMOS transistors M9 and M10. In certain aspects, the NMOS transistors M9 and M10 are implemented by I/O devices to withstand higher voltages, whereas other active components of the voltage generator 400 may be implemented as core devices. The PMOS transistor M8 has a gate coupled to the output of the amplifier 402, a source coupled to the low power supply rail, and a drain coupled to the drain and the gate of the NMOS transistor M9 and to the gate of the NMOS transistor M10. The sources of the NMOS transistors M9 and M10 are coupled to the reference potential node for the voltage generator 400. With transistor M8 being similar to transistor M7, the amplifier 402 will also control transistor M8 to have the same reference current ibias, and transistor M8 functions as the current source in the current mirror 413. Therefore, the load of the current mirror 413 will also experience a load current of ibias, as illustrated in FIG. 4, the load of the current mirror being the resistive elements 414, 416, 418, and 420. This load current is sourced from the high power supply domain (VDDH). With the resistive elements 404, 406, 408, 410, 412, 414, 416, 418, and 420 all having the same resistance R, the load current of ibias will create a voltage drop of VDD across the series-connected resistive elements 414, 416, 418, and 420

(analogous to the voltage drop of VDD across the series-connected resistive elements 404, 406, 408, and 410). Therefore, the voltage at the drain of NMOS transistor M10 (labeled "Vlow") will be VDDH−VDD, regulated by the amplifier 402, the transistor M7, and the current mirror 413.

Example Buffer Stage for SerDes Transmitter

Figure 5:
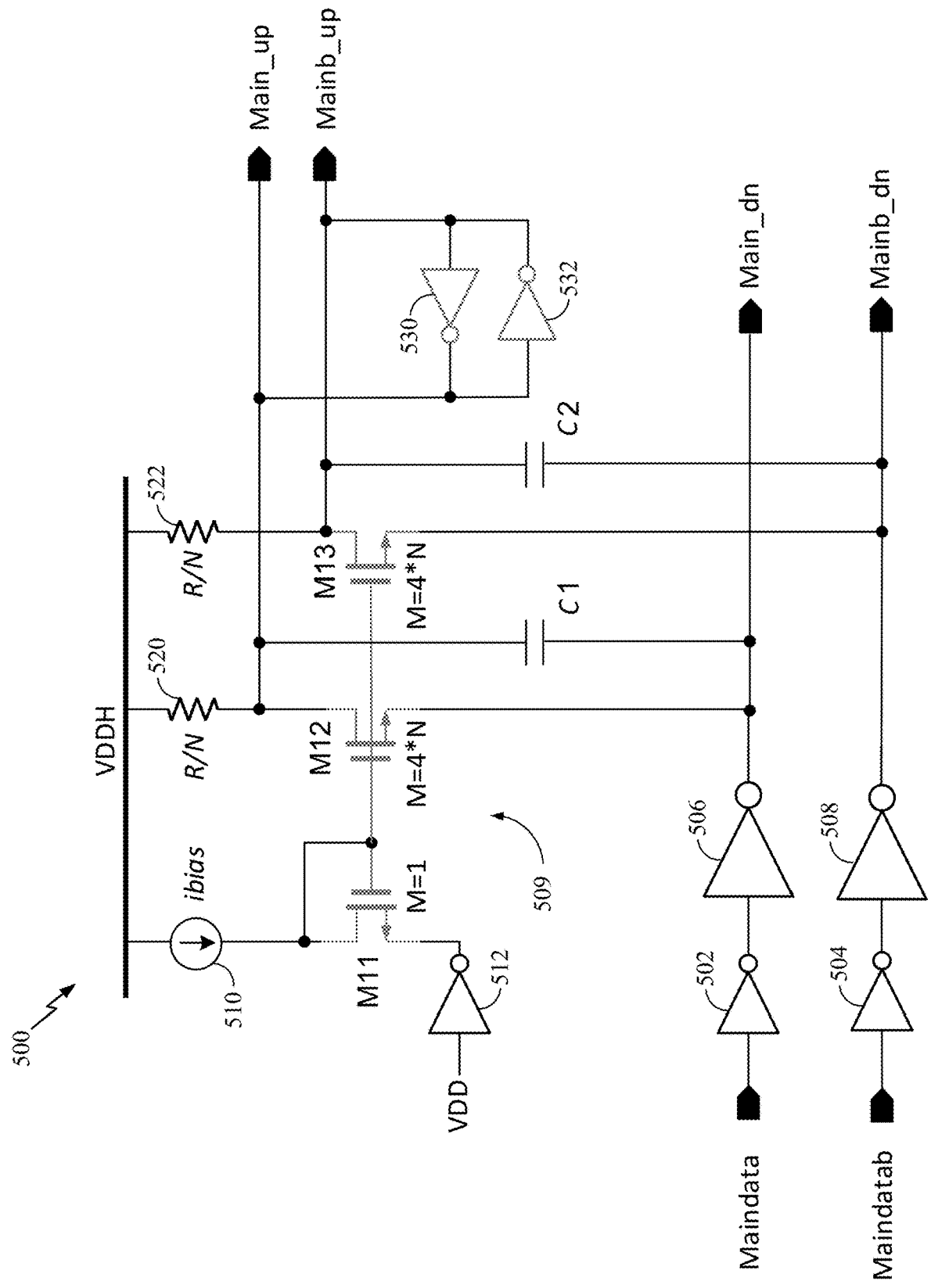
FIG. 5 is a circuit diagram of an example common-gate buffer circuit for the SerDes transmitter of FIG. 2, in accordance with certain aspects of the present disclosure.

FIG. 5 is a circuit diagram of an example common-gate buffer circuit 500, which may be used to implement the buffer circuit 208 in the SerDes transmitter 200 of FIG. 2, in accordance with certain aspects of the present disclosure. The circuit diagram of FIG. 5 also includes an example pre-driver, which may be used to implement the pre-driver circuit 202 in the SerDes transmitter 200.

As described above, the pre-driver may receive one or more input signals (such as the differential input signal Maindata/Maindatab) and generate one or more output signals (such as the differential output signal Main_dn/Main_dnb) for the buffer circuit 500 and the driver output stage circuit 330. The pre-driver may be implemented by two inverter stages. The first inverter stage may include inverters 502 and 504, and the second inverter stage may include inverters 506 and 508. In certain aspects, the inverters 506 and 508 have a greater driving ability than that of the inverters 502 and 504. The first and second inverter stages may be powered by the relatively low power supply rail (VDD), such that the output signal(s) have a voltage swing from 0 V to VDD.

As illustrated in FIG. 5, the common-gate buffer circuit 500 is powered from the relatively high power supply rail (VDDH) and includes a current mirror 509 and resistive elements 520 and 522. The current mirror 509 includes a current source 510, an inverter 512, and NMOS transistors M11, M12, and M13. The current source 510 is coupled between the high power supply rail (VDDH) and the drain of transistor M11. The drain of transistor M11 is coupled to the gates of transistor M11, M12, and M13. The source of transistor M11 is coupled to the output of the inverter 512, where the input of the inverter 512 is coupled to the low power supply rail (VDD). The inverters 512, 502, 504, 506, and 508 may all receive power from the low power supply rail (VDD). The source of transistor M12 is coupled to the output of the inverter 506, and the source of transistor M13 is coupled to the output of inverter 508. The drain of transistor M12 is coupled to the resistive element 520 and functions as a first output node of the buffer circuit 500, and the drain of transistor M13 is coupled to the resistive element 522 and functions as a second output node of the buffer circuit 500.

The current source 510 may provide a reference current (labeled "ibias") that is equal to the reference current of the voltage generator 400. The resistive elements 520 and 522 may have a resistance R/N, where N is a factor greater than or equal to 1 and may be an integer (e.g., N=20). The factor N may depend on the desired current. If transistor M11 has a size of M=1, then transistors M12 and M13 may have a size of M=4N. Therefore, the current through transistor M12 (or M13) may be 4N*ibias when the source of transistor M12 (or M13) is at 0 V. The transistors M12 and M13 are configured as common-gate buffers, with the sources of transistors M12 and M13 being the inputs to the buffers, the drains of transistors M12 and M13 being the outputs of the buffers, and the gates of transistors M12 and M13 receiving the bias voltages. The transistors M11, M12, and M13 may be implemented as I/O devices, whereas other active devices in the circuit 500 and the pre-driver may be implemented as core devices.

As an example during operation, when Maindata=VDD and Maindatab=0 V, Main_dn=VDD and Main_dnb=0 V at the output of the pre-driver. In this case, the current through resistive element 522 and transistor M13 will be 4N*ibias, and the voltage drop across resistive element 522 will be VDD (=4N*ibias*R/N=4R*ibias). Thus, the Main upb signal will have a voltage of VDDH−VDD=Vlow. Furthermore, transistor M12 will function as a common-gate buffer, with little to no current through the resistive element 520 and the transistor M12. Therefore, the Main up signal will have a voltage of VDDH, such that the Main up/Main upb differential signal maintains a voltage swing of VDD, the same voltage swing as the Main_dn/Main_dnb differential signal.

In certain aspects, the common-gate buffer circuit 500 may include a shunt capacitor C1 coupled between the drain and the source of transistor M12 and a shunt capacitor C2 coupled between the drain and the source of transistor M13. The shunt capacitors C1 and C2 may assist with fast transitions from the input of the buffer (the source of transistor M12 or M13) to the output of the buffer (the drain of transistor M12 or M13) during high frequency operation.

In certain aspects, the common-gate buffer circuit 500 may include a pair of anti-parallel inverters 530, 532 coupled between the output nodes (e.g., between the drains of the transistors M12 and M13. Each of the anti-parallel inverters 530, 532 may have power supply inputs coupled between VDDH and Vlow, such that the outputs of the inverters 530, 532 can swing between Vlow and VDDH. The anti-parallel inverters 530, 532 may make the voltage swing faster at the output nodes. In certain aspects, the anti-parallel inverters 530, 532 may be implemented as I/O devices.

Example Operations for Driving Data

Figure 6:
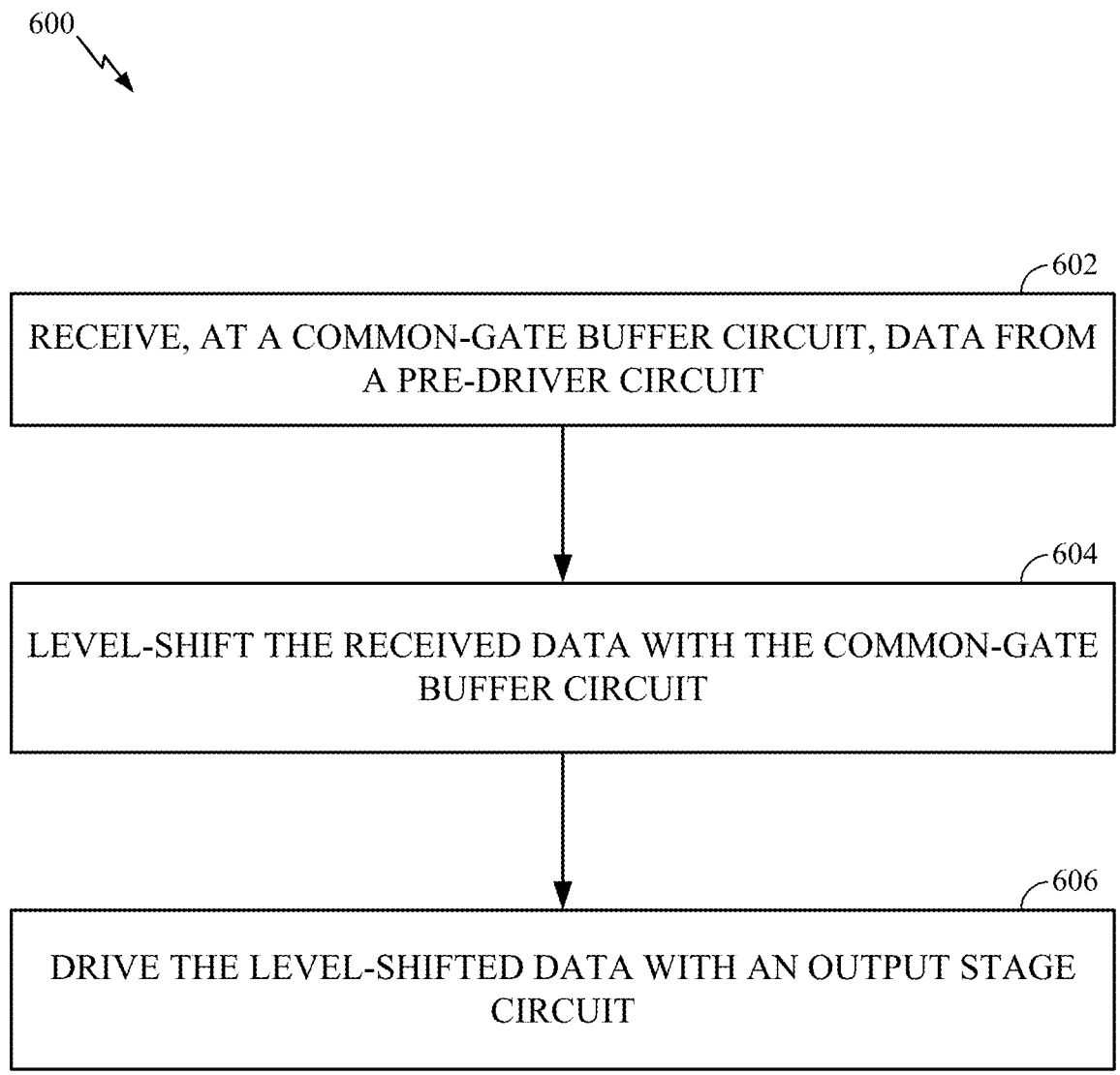
FIG. 6 is a flow diagram of example operations for driving data, in accordance with certain aspects of the present disclosure.

FIG. 6 is a flow diagram of example operations 600 for driving data, in accordance with certain aspects of the present disclosure. The operations 600 may be performed, for example, by a SerDes transmitter (e.g., the SerDes transmitter 200 of FIG. 2).

The operations 600 may begin, at block 602, with a common-gate buffer circuit (e.g., the common-gate buffer circuit 500) receiving the data from a pre-driver circuit (e.g., the pre-driver circuit 202). At block 604, the common-gate buffer circuit may level-shift the received data, and at block 606, an output stage circuit (e.g., the driver output stage circuit 330) may drive the level-shifted data.

As described herein, certain aspects of the present disclosure provide a driver circuit for a SerDes transmitter (e.g., the SerDes transmitter 200). The driver circuit generally includes a pre-driver circuit (e.g., pre-driver circuit 202), an output stage circuit (e.g., driver output stage circuit 204), and a common-gate buffer circuit (e.g., common-gate buffer circuit 500) coupled between an output of the pre-driver circuit and a first input of the output stage circuit.

According to certain aspects, the common-gate buffer circuit includes a first transistor (e.g., transistor M12) having a source coupled to the output of the pre-driver circuit and having a drain coupled to the first input of the output stage circuit. For certain aspects, the first transistor comprises an input/output transistor with a relatively higher breakdown voltage than a core transistor. In certain aspects, the common-gate buffer circuit includes a current mirror circuit that comprises the first transistor, a current source (e.g., the current source 510), and a second transistor (e.g., transistor M11) having a gate coupled to a gate of the first transistor, to a drain of the second transistor, and to a first terminal of the current source. In this case, a second terminal of the current source may be coupled to a first power supply rail (e.g., VDDH). For certain aspects, the common-gate buffer circuit further includes a resistive element (e.g., resistive element 520) coupled between the first power supply rail and the drain of the first transistor. For certain aspects, the common-gate buffer circuit further includes a capacitive element (e.g., shunt capacitor C1) coupled between the drain and the source of the first transistor. For certain aspects, the pre-driver circuit is configured to receive power from a second power supply rail (e.g., VDD), where a voltage of the first power supply rail is greater than a voltage of the second power supply rail. In this case, the output of the pre-driver circuit may be coupled to a second input of the output stage circuit, and the first input of the output stage circuit may be configured to have a first voltage range between: (1) a difference between the voltage of the first power supply rail and the voltage of the second power supply rail; and (2) the voltage of the first power supply rail. Also, the second input of the output stage circuit may be configured to have a second voltage range between a voltage (e.g., 0 V) of a reference potential node (e.g., electrical ground) for the driver circuit and the voltage of the second power supply rail.

According to certain aspects, the output of the pre-driver circuit is coupled to a second input of the output stage circuit. In this case, the output stage circuit may include a first transistor (e.g., transistor M1a or M1b) having a source coupled to a first power supply rail (e.g., VDDH); a second transistor (e.g., transistor M2a or M2b) having a source coupled to a drain of the first transistor, having a gate coupled to the first input of the output stage circuit, and having a drain coupled to an output of the output stage circuit; a third transistor (e.g., transistor M3a or M3b) having a drain coupled to the output of the output stage circuit and having a gate coupled to the second input of the output stage circuit; and a fourth transistor (e.g., transistor M4a or M4b) having a drain coupled to the source of the third transistor and having a source coupled to a reference potential node (e.g., electrical ground) for the driver circuit. For example, the first transistor and the second transistor are p-type metal-oxide-semiconductor (PMOS) transistors, and the third transistor and the fourth transistor are n-type metal-oxide-semiconductor (NMOS) transistors. For certain aspects, the driver circuit further includes a fifth transistor (e.g., transistor M5a or M5b) having a source coupled to the first power supply rail and having a drain coupled to a gate of the first transistor; a sixth transistor (e.g., transistor M6a or M6b) having a gate coupled to a gate of the fifth transistor and having a source coupled to the gate of the first transistor; and a voltage generation circuit (e.g., voltage generation circuit 206), wherein a drain of the sixth transistor is coupled to an output of the voltage generation circuit. For certain aspects, the voltage generation circuit includes a first array of series-connected resistive elements (e.g., resistive elements 404, 406, 408, and 410), the first array being coupled between a second power supply rail (e.g., VDD) and the reference potential node, the second power supply rail having a voltage that is lower than a voltage of the first power supply rail; an amplifier (e.g., amplifier 402) having a first input coupled to a tap of the first array of series-connected resistive elements; a seventh transistor (e.g., transistor M7) having a source coupled to the second power supply rail, having a drain coupled to a second input of the amplifier, and having a gate coupled to an output of the amplifier; a resistive element (e.g., resistive element 412) coupled between the drain of the seventh transistor and the reference potential node; and a current mirror circuit (e.g., current mirror 413) coupled between the output of the amplifier and the output of the voltage generation circuit. For certain aspects, the voltage generation circuit further includes a second array of series-connected resistive elements (e.g., resistive elements 414, 416, 418, and 420) coupled between the first power supply rail and the output of the voltage generation circuit. In this case, the amplifier, the seventh transistor, and the resistive element may be configured to regulate a first current (e.g., ibias) through the seventh transistor; the current mirror circuit may have a current source (e.g., transistor M8) configured to source a second current (e.g., ibias) based on the first current and may be configured to replicate the second current as a third current (e.g., ibias) through an output branch (e.g., through transistor M10) of the current mirror circuit, such that the third current is equal to the first current; a resistance of the resistive element may be equal to a resistance between the tap and the reference potential node; and a total resistance of the first array of series-connective resistive elements may be equal to a total resistance of the second array of series-connective resistive elements, such that a voltage drop across the first array of series-connected resistive elements is equal to a voltage drop across the second array of series-connected resistive elements. For certain aspects, the fifth transistor and the sixth transistor comprise input/output transistors with a relatively higher breakdown voltage than a core transistor.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A driver circuit for a serializer/deserializer (SerDes) transmitter, the driver circuit comprising:
   a pre-driver circuit comprising a first pair of differential outputs;
   an output stage circuit comprising a first pair of differential inputs and a second pair of differential inputs, the first pair of differential inputs being coupled to the first pair of differential outputs of the pre-driver circuit; and
   a common-gate buffer circuit comprising:
      a second pair of differential outputs coupled to the second pair of differential inputs of the output stage circuit, and
      a third pair of differential inputs coupled to the first pair of differential outputs of the pre-driver circuit.

2. The driver circuit of claim 1, wherein the common-gate buffer circuit comprises a first transistor having a source coupled to one of the first pair of differential outputs of the pre-driver circuit and having a drain coupled to one of the first pair of differential inputs of the output stage circuit.

3. The driver circuit of claim 2, wherein the first transistor comprises an input/output transistor.

4. The driver circuit of claim 1, wherein the output stage circuit comprises:
   a first transistor having a source coupled to a first power supply rail;
   a second transistor having a source coupled to a drain of the first transistor, having a gate coupled to one of the first pair of differential inputs of the output stage circuit, and having a drain coupled to an output of the output stage circuit;
   a third transistor having a drain coupled to the output of the output stage circuit and having a gate coupled to another one of the first pair of differential inputs of the output stage circuit; and
   a fourth transistor having a drain coupled to the source of the third transistor and having a source coupled to a reference potential node for the driver circuit.

5. The driver circuit of claim 4, wherein the first transistor and the second transistor are p-type metal-oxide-semiconductor (PMOS) transistors and wherein the third transistor and the fourth transistor are n-type metal-oxide-semiconductor (NMOS) transistors.

6. The driver circuit of claim 4, further comprising:
   a fifth transistor having a source coupled to the first power supply rail and having a drain coupled to a gate of the first transistor;
   a sixth transistor having a gate coupled to a gate of the fifth transistor and having a source coupled to the gate of the first transistor; and
   a voltage generation circuit, wherein a drain of the sixth transistor is coupled to an output of the voltage generation circuit.

7. The driver circuit of claim 6, wherein the voltage generation circuit comprises:
   a first array of series-connected resistive elements, the first array being coupled between a second power supply rail and the reference potential node, the second power supply rail having a voltage that is lower than a voltage of the first power supply rail;
   an amplifier having a first input coupled to a tap of the first array of series-connected resistive elements;
   a seventh transistor having a source coupled to the second power supply rail, having a drain coupled to a second input of the amplifier, and having a gate coupled to an output of the amplifier;
   a resistive element coupled between the drain of the seventh transistor and the reference potential node; and
   a current mirror circuit coupled between the output of the amplifier and the output of the voltage generation circuit.

8. The driver circuit of claim 7, wherein the voltage generation circuit further comprises a second array of series-connected resistive elements coupled between the first power supply rail and the output of the voltage generation circuit.

9. The driver circuit of claim 8, wherein:
   the amplifier, the seventh transistor, and the resistive element are configured to regulate a first current through the seventh transistor;
   the current mirror circuit has a current source configured to source a second current based on the first current and is configured to replicate the second current as a third current through an output branch of the current mirror circuit, such that the third current is equal to the first current;
   a resistance of the resistive element is equal to a resistance between the tap and the reference potential node; and a total resistance of the first array of series-connective resistive elements is equal to a total resistance of the second array of series-connective resistive elements, such that a voltage drop across the first array of series-connected resistive elements is equal to a voltage drop across the second array of series-connected resistive elements.

10. The driver circuit of claim 6, wherein the fifth transistor and the sixth transistor comprise input/output transistors.

11. A serializer/deserializer (SerDes) device comprising the driver circuit of claim 1, the SerDes device further comprising:
a serializer; and
a deserializer, wherein the driver circuit is coupled between an output of the serializer and an input of the deserializer.

12. A driver circuit for a serializer/deserializer (SerDes) transmitter, the driver circuit comprising:
a pre-driver circuit;
an output stage circuit; and
a common-gate buffer circuit coupled between an output of the pre-driver circuit and a first input of the output stage circuit, the common-gate buffer circuit comprising:
a first transistor having a source coupled to the output of the pre-driver circuit and having a drain coupled to the first input of the output stage circuit; and
a current mirror circuit comprising:
the first transistor;
a current source; and
a second transistor having a gate coupled to a gate of the first transistor, to a drain of the second transistor, and to a first terminal of the current source, a second terminal of the current source being coupled to a first power supply rail.

13. The driver circuit of claim 12, wherein the common-gate buffer circuit further comprises a resistive element coupled between the first power supply rail and the drain of the first transistor.

14. The driver circuit of claim 12, wherein the common-gate buffer circuit further comprises a capacitive element coupled between the drain and the source of the first transistor.

15. The driver circuit of claim 12, wherein the pre-driver circuit is configured to receive power from a second power supply rail and wherein a voltage of the first power supply rail is greater than a voltage of the second power supply rail.

16. The driver circuit of claim 15, wherein:
the output of the pre-driver circuit is coupled to a second input of the output stage circuit;
the first input of the output stage circuit is configured to have a first voltage range between:
a difference between the voltage of the first power supply rail and the voltage of the second power supply rail; and
the voltage of the first power supply rail; and
the second input of the output stage circuit is configured to have a second voltage range between a voltage of a reference potential node for the driver circuit and the voltage of the second power supply rail.

17. A method of driving data for a serializer/deserializer (SerDes) transmitter, the method comprising:
receiving, at a common-gate buffer circuit, the data from a pre-driver circuit;
level-shifting the received data with the common-gate buffer circuit; and
driving the level-shifted data with an output stage circuit, wherein the common-gate buffer circuit comprises:
a first transistor having a source coupled to an output of the pre-driver circuit and having a drain coupled to an input of the output stage circuit; and
a current mirror circuit comprising:
the first transistor;
a current source; and
a second transistor having a gate coupled to a gate of the first transistor, to a drain of the second transistor, and to a first terminal of the current source, a second terminal of the current source being coupled to a power supply rail.

18. The method of claim 17, wherein:
the received data from the pre-driver circuit has a first voltage swing between a first voltage level and a second voltage level;
the second voltage level is greater than the first voltage level;
the level-shifted data has a second voltage swing between a third voltage level and a fourth voltage level;
the third voltage level is between the first voltage level and the second voltage level; and
the fourth voltage level is greater than the second voltage level.

19. The method of claim 18, further comprising generating the third voltage level with a voltage generation circuit, wherein the voltage generation circuit comprises:
a first array of series-connected resistive elements, the first array being coupled between a first power supply rail at the second voltage level and a reference potential node at the first voltage level;
an amplifier having a first input coupled to a tap of the first array of series-connected resistive elements;
a third transistor having a source coupled to the first power supply rail, having a drain coupled to a second input of the amplifier, and having a gate coupled to an output of the amplifier;
a resistive element coupled between the drain of the first transistor and the reference potential node, wherein the current mirror circuit is coupled between the output of the amplifier and an output of the voltage generation circuit at the third voltage level; and
a second array of series-connected resistive elements coupled between a second power supply rail at the fourth voltage level and the output of the voltage generation circuit.

20. The method of claim 17, wherein the common-gate buffer circuit further comprises:
a resistive element coupled between the power supply rail and the drain of the first transistor; and
a capacitive element coupled between the drain and the source of the first transistor.

* * * * *